(12) United States Patent
Rampley et al.

(10) Patent No.: US 8,790,947 B2
(45) Date of Patent: Jul. 29, 2014

(54) THREE-DIMENSIONAL SOLAR CELL HAVING INCREASED EFFICIENCY

(75) Inventors: Colby G. Rampley, Phoenix, AZ (US); Frank T. Laver, Queen Creek, AZ (US); Thomas E. Wood, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 153 days.

(21) Appl. No.: 13/272,285

(22) Filed: Oct. 13, 2011

(65) Prior Publication Data

US 2013/0092223 A1    Apr. 18, 2013

(51) Int. Cl.
*H01L 31/0216* (2014.01)
*H01L 31/18* (2006.01)

(52) U.S. Cl.
USPC ......... 438/57; 438/71; 257/E31.119; 136/256

(58) Field of Classification Search
USPC ........ 428/57; 257/E31.119; 136/256; 438/57, 438/71
See application file for complete search history.

(56) References Cited

U.S. PATENT DOCUMENTS

| | | |
|---|---|---|
| 7,847,180 B2 | 12/2010 | Argo et al. |
| 8,344,241 B1 * | 1/2013 | Vidu et al. .................. 136/252 |
| 2011/0277827 A1 * | 11/2011 | Yang et al. .................. 136/255 |

OTHER PUBLICATIONS

Sandru; "3D Nanocone Solar Cells Improve Efficiency by 80% in Lab Experiments"; IB Times Green Economy; May 2, 2011; 1 pg; http://uk.ibtimes.com/articles/20110502/3d-nanocone-solar-cells-improve-efficiency-by-80-in-lab-experiments.htm.
Toon; "Nano-Manhattan: 3D Solar Cells Boost Efficiency While Reducing Size, Weight and Complexity of Photovoltaic Arrays"; Georgia Tech Research News; Apr. 11, 2007; 3 pages; http://gtresearchnews.gatech.edu/newsrelease/3d-solar.htm.

* cited by examiner

*Primary Examiner* — Robert Carpenter
(74) *Attorney, Agent, or Firm* — Jonathan N. Geld

(57) ABSTRACT

A nano-scale tower structure array having increased surface area on each tower for gathering incident light is provided for use in three-dimensional solar cells. Embodiments enhance surface roughness of each tower structure to increase the surface area available for light gathering. Enhanced roughness can be provided by manipulating passivation layer etching parameters used during a formation process of the nano-scale tower structures, in order to affect surface roughness of a photoresist layer used for the etch. Manipulable etching parameters can include power, gas pressure, and etching compound chemistry.

8 Claims, 3 Drawing Sheets

THREE-DIMENSIONAL SOLAR CELL HAVING INCREASED EFFICIENCY

BACKGROUND

1. Field

This disclosure relates generally to photovoltaic systems, and more specifically, to improving light gathering efficiency of three-dimensional solar cells.

2. Related Art

Conventional solar cells present a flat surface to incident light. One drawback of flat solar cells is that a significant portion of the incident light is reflected, which reduces the amount of light energy absorbed by the solar cell. Further, the photovoltaic coating of a flat solar cell must be thick enough to capture photons of the incident light. The energy of the photons liberates electrons from the photovoltaic materials to create an electrical current with each mobile electron leaving behind a "hole" in the atomic matrix of the photovoltaic coating. The longer it takes for electrons to exit the photovoltaic material (i.e., to flow in a conductive material), the more likely it is for the electron to recombine with a hole. This reduces electrical current generated by the solar cell.

Three-dimensional solar cells provide some solutions to the above drawbacks of conventional solar cells. Rather than presenting a flat surface to incident light, a three-dimensional solar cell presents a brush-like surface of nano-scale tower structures. These tower structures can trap and absorb light received from many different angles, thereby remaining efficient even when incident light is arriving at a significant angle to the plane of the solar cell. In addition, the photovoltaic coatings of the tower structures can be made thinner, which reduces a likelihood that electron-hole recombination can take place.

One reason that three-dimensional solar cells are more efficient than flat solar cells at collecting energy from incident light is that the three-dimensional solar cells present more surface area to capture the incident light then do the flat solar cells. If the light gathering surface area of the nano-scale tower structures is increased, then the light gathering efficiency of three-dimensional solar cells can also be increased.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

A nano-scale tower structure array having increased surface area on each tower for gathering incident light is provided for use in three-dimensional solar cells. Embodiments of the present invention enhance surface roughness of each tower structure to increase the surface area available for light gathering. In one embodiment, this enhanced roughness is provided by manipulating photoresist etching parameters used during a formation process of the nano-scale tower structures. Manipulable etching parameters can include power, gas pressure, and etching compound chemistry.

A typical three-dimensional solar cell presents a brush-like array of nano-scale tower structures to capture incident light. A thin coating of photovoltaic material is provided on each of the tower structures to capture and convert the energy from the incident light. Released electrons then flow in a circuit provided, in part, by the conductive core of the tower structure and a thin conductive coating over the photovoltaic material.

Figure 1:
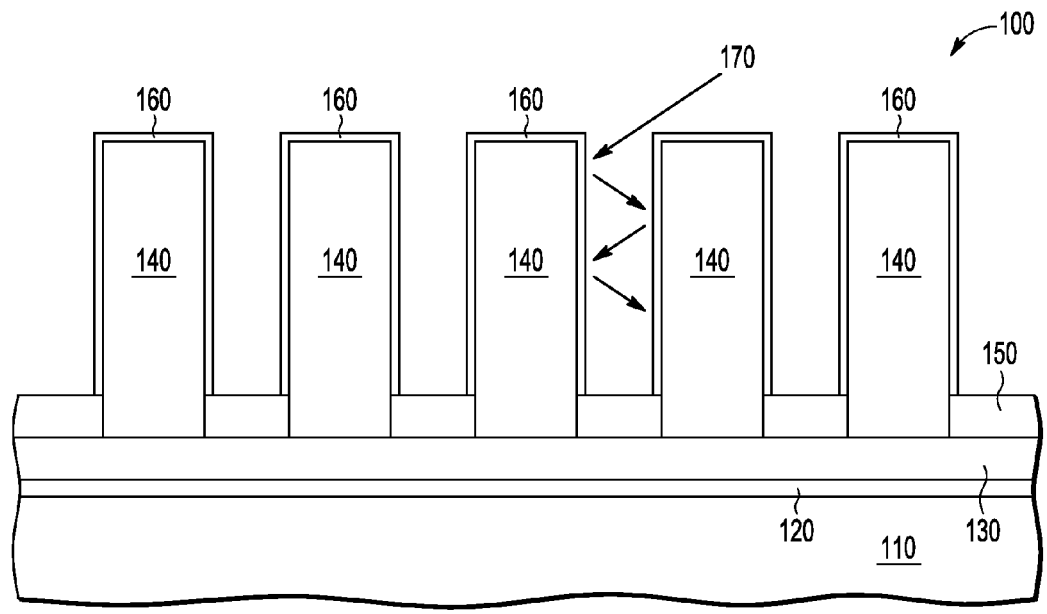
FIG. 1 is a simplified block diagram illustrating a structure of a typical three-dimensional solar cell.

FIG. 1 is a simplified block diagram illustrating a structure of a typical three-dimensional solar cell. Three-dimensional solar cell 100 is formed on a substrate 110, which can be a variety of materials including, for example, a semiconductor, glass, insulator, and the like. A semiconductor substrate can be any semiconductor material or combinations of materials, such as gallium arsenide, silicon germanium, silicon-on-insulator (SOI), silicon, monocrystalline silicon, and the like and combinations of the above. An insulating layer 120 is formed on substrate 110. In one embodiment, insulating layer 120 is a dielectric (e.g., silicon dioxide, silicon nitride, silicon oxynitride, or any combination of such layers) formed by an oxidation process or deposited, depending on the nature of the substrate. Choice of materials for the substrate and insulating layer can be made depending upon the needs of the application.

A conductive layer 130 is provided above insulating layer 120. Conductive layer 130 provides part of the circuit for flow of electrons released by incident light in the three-dimensional solar cell. Conductive layer 130 can be any conductive material including, but not limited to, metal, metal alloy, doped polysilicon, doped amorphous silicon, nitride or silicide. In one embodiment, conductive layer 130 is a metal alloy including one or more of titanium, aluminum, copper, nickel, and tungsten.

On conductive layer 130 is formed an array of nano-scale tower structures 140. In three-dimensional solar cells known in the art, the core material of tower structures 140 can be a variety of conducting materials, such as, for example, carbon nanotubes, nickel, zinc, and other metals suitable for forming nano-scale structures. Also formed on conductive layer 130 is a passivation layer 150. As with conventional solar cells, passivation layer 150 is provided to reduce surface recombination of electrons and holes. Passivation layer 150 can be formed of a variety of insulative oxides and nitride, including, for example, silicon nitride, silicon oxide, titanium oxide, and the like.

A photovoltaic coating 160 is formed over the surface of nano-scale tower structures 140. Photovoltaic coating 160 provides for conversion of incident photon energy to electrical energy. One example of a photovoltaic coating appropriate for use in three-dimensional solar cells is cadmium telluride, which provides a p-type photovoltaic layer. Another example of an appropriate photovoltaic coating is cadmium sulfide, which provides an n-type photovoltaic layer. One method for forming the photovoltaic coating uses molecular beam epitaxy to grow the coating. Finally, a thin coating of a clear conducting material (not shown) is provided over the photovoltaic layer to serve as the solar cell's top electrode. An example of such a clear conducting material is indium tin oxide.

A typical three-dimensional solar cell will have tower structures approximately 100 microns in height and approximately 40 microns in width. The towers can be spaced approximately 10 to 20 microns apart in an array.

As shown in FIG. 1, incident light 170 can impact a surface of one of the tower structures and have some of the incident light reflect into the depths of the array of tower structures. The reflected light provides photonic energy to the surface of each incident tower structure for conversion to released electrons. This reflection and subsequent energy conversion does not happen with a flat solar cell, since non-absorbed light is reflected away from the surface of the solar cell and lost to energy conversion. This loss of reflected photons is enhanced at large angles of incidence of light. It should be understood that FIG. 1 provides a cross-sectional illustration of a three-dimensional array of tower structures, and that the array of structures are repeated both above and below the plane of the illustration.

A drawback of traditional three-dimensional solar cells is that although they provide enhanced energy generation from incident light over a flat solar cell, ultimately incident light reaches passivation layer 150 and is reflected back out of the array of tower structures. To avoid this, embodiments of the present invention provide for additional surface area on the tower structures to capture incident light. This additional surface area is created by increasing surface roughness of the tower structures. Further, light reflected from the roughened surfaces of the tower structures is scattered, thereby increasing a number of reflected "hits" on surfaces of other tower structures and increasing chances of absorption. Thus, the conversion efficiency of the three-dimensional solar cell is increased for each unit of incident photonic energy over a traditional three-dimensional solar cell.

Figure 2:
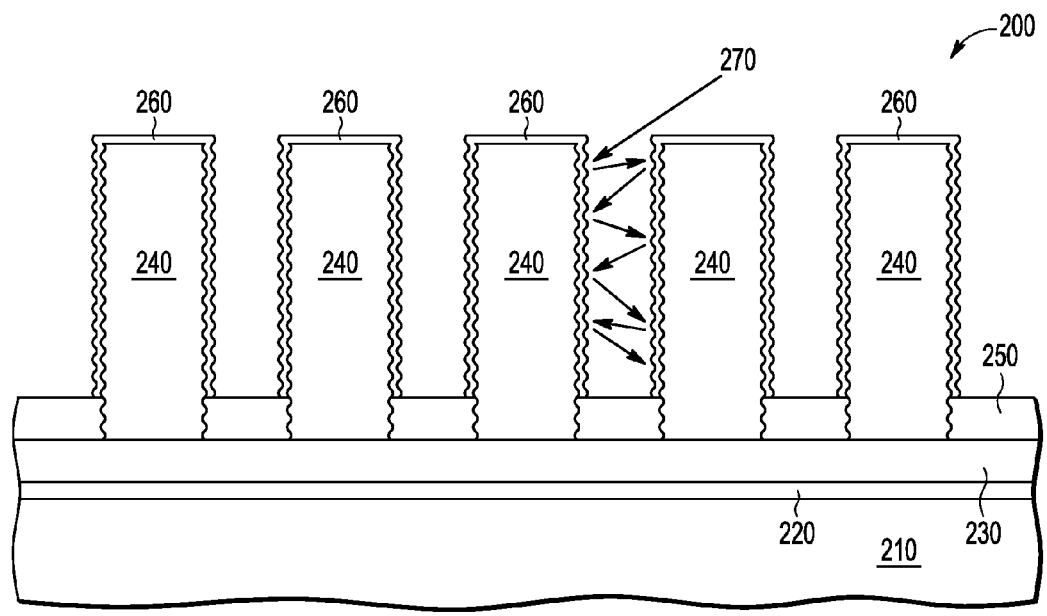
FIG. 2 is a simplified block diagram illustrating one embodiment of a three-dimensional solar cell having increased area on the tower structures for collection of incident photonic energy.

FIG. 2 is a simplified block diagram illustrating one embodiment of a three-dimensional solar cell having increased area on the tower structures for collection of incident photonic energy. Substrate 210, insulating layer 220, conductive layer 230, and passivation layer 250 each correspond to layers 110, 120, 130, and 150, respectively. Materials used for the formation of the layers in FIG. 2 can be chosen from the same types of materials used for the corresponding layers in FIG. 1.

On conductive layer 230 is formed an array of nano-scale tower structures 240, similar to the process described above for FIG. 1. The core material of tower structures 240 can be a variety of conducting materials, such as, for example, nickel, zinc, and other metals suitable for forming nano-scale structures. Unlike in FIG. 1, however, tower structures 240 have a surface roughness imparted by processing techniques described more fully below. The degree of surface roughness is selectively imparted upon the tower structures in order to enhance the light-gathering capacity of the three-dimensional solar cell by: (a) increasing the available surface area of the tower structures to gather incident light energy, and (b) causing enhanced scattering of incident photons within the brush-like array of tower structures to increase likelihood of absorption of light energy on the surface of the tower structures. As with FIG. 1, the tower structures are provided with a photovoltaic coating 260 (e.g., CdTe or CdS) to enable the conversion of incident photons to mobile electrons and a clear conducting material (not shown) to aid in conduction of the electrons to form a circuit. The roughness of the tower structure sidewalls is repeated in the surface of the photovoltaic coating and clear conducting material, as these layers follow the underlying surface of the tower structures.

FIG. 2 illustrates a reflection path that incident light 270 can follow in an array of rough-surfaced tower structures. As can be seen, not only does the surface roughness of the tower structures increase the surface area of each tower structure, but also the light can be absorbed and reflected additional times between the towers due to increased light scattering from the rough surface. The likelihood of energy conversion of a photon to a free electron is thereby increased and the likelihood of light arriving at the surface of passivation layer 250 and being reflected away from the three-dimensional solar cell is decreased.

Figure 3:
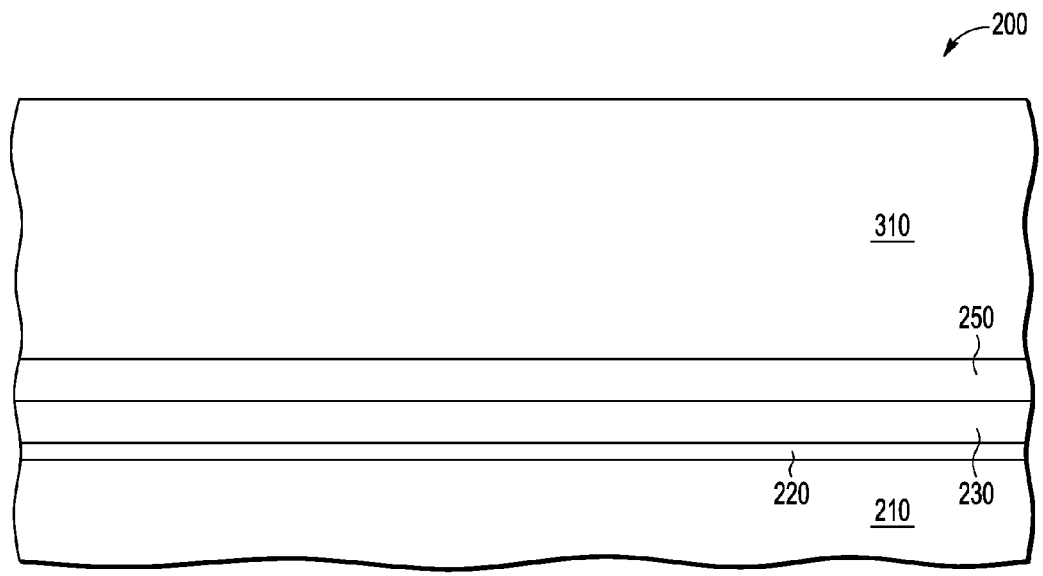
FIG. 3 is a simplified block diagram illustrating a cross sectional view of a three-dimensional solar cell assembly structure at a stage of processing, according to an embodiment of the present invention.

FIG. 3 is a simplified block diagram illustrating a cross sectional view of a three-dimensional solar cell structure at a stage of processing, according to an embodiment of the present invention. As described above, a substrate 210 is provided over which an insulating layer or adhesion layer 220 is formed. Conductive layer 230 is formed over adhesion layer 220, and passivation layer 250 is formed over conductive layer 230. Choices of materials for layers 210, 220, 230, and 250 are described above. Formation of these layers can be performed using techniques known in the art of semiconductor manufacturing.

A photoresist layer 310 is formed over passivation layer 250. A variety of photoresist materials known in the art can be used, including, for example, PMMA, PMGI, phenol formaldehyde resin, and epoxy-based photoresists. Photoresist layer 310 can be applied in a manner acceptable for the type of photoresist, as known in the art. In one embodiment, a photoresist layer 310 is applied as a liquid and spin-coated to ensure a uniform thickness over a panel including the underlying layers.

Figure 4:
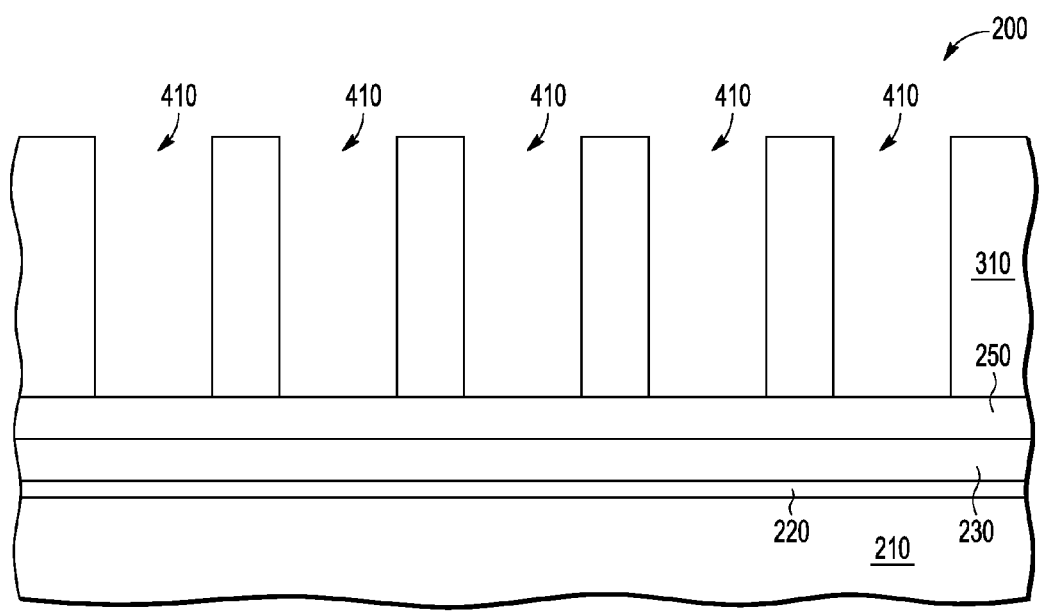
FIG. 4 is a simplified block diagram illustrating the cross sectional view of the three-dimensional solar cell assembly structure at a later stage in processing, according to an embodiment of the present invention.

FIG. 4 is a simplified block diagram illustrating the cross-sectional view of the three-dimensional solar cell structure at a later stage in processing. Holes 410 are formed in photoresist layer 310 by a photolithographic process (e.g., patterning and developing). Patterning of the photoresist is performed to lay out regions for holes 410 in accord with the desired array of tower structures for the ultimate three-dimensional solar cell. The holes extend through the photoresist layer to the surface of passivation layer 250.

Figure 5:
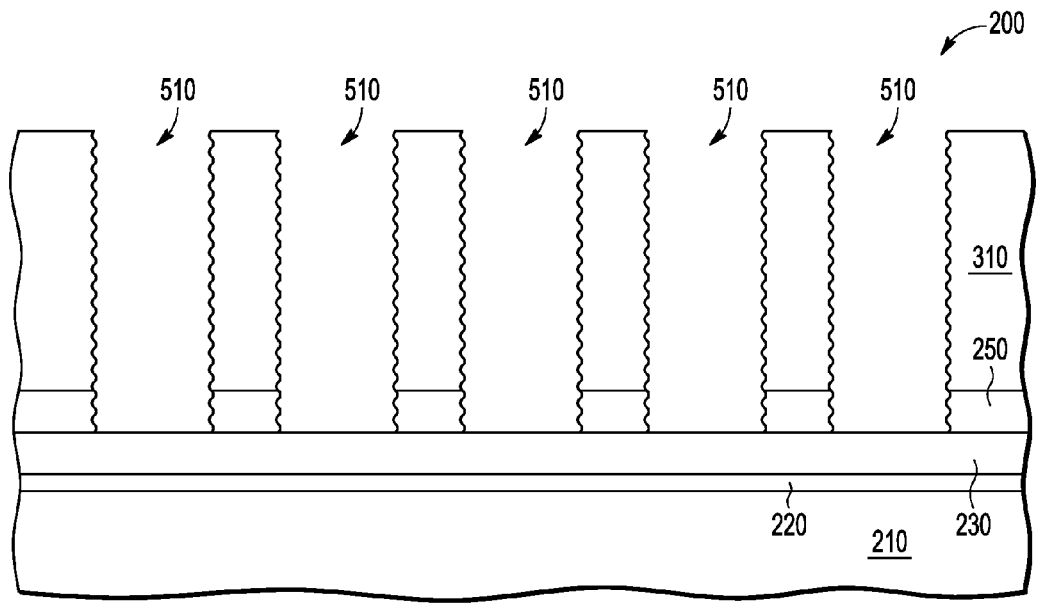
FIG. 5 is a simplified block diagram illustrating the cross sectional view of the three-dimensional solar cell assembly structure at a later stage in processing, according to an embodiment of the present invention.

FIG. 5 is a simplified block diagram illustrating the cross-sectional view of the three-dimensional solar cell structure at a later stage in processing. Holes 510 are formed in passivation layer 250 by a dry etch process. As illustrated, holes 510 are formed in a manner that provides rough sidewalls of the holes as they extend through photoresist layer 310 to the passivation layer. Surface roughness, or texture, of the holes is selectively determined by manipulating chemistry, pressure, temperature, and energy of the etching process used to form the holes in the passivation layer. For example, one or more of increasing etch power, decreasing etch pressure, and increasing flow rate of certain etch chemicals results in a more aggressive etch that results in rougher hole sidewalls than would a less aggressive etch. Table 1 provides one example of changes in passivation layer etch process parameters that differentiate between smooth holes in the photoresist and rough holes in the photoresist. It should be noted that different photoresists and different etch chemistries may have different values and delta values to result in desired surface roughness.

TABLE 1

|  | Smooth | Rough |
|---|---|---|
| Power | 1100 W | 1300 W |
| Pressure | 700 mT | 500 mT |
| Etch Chemical Flow | 16 sccm | 32 sccm |

Surface roughness is valued in a variety of ways. In one valuation of surface roughness, $R_a$, a mean of absolute values of profile heights, is measured from a mean line averaged over the profile. For some metals, a surface roughness of 1.6 µm results in sufficient scattering of incident light that the surface is nearly non-reflective. Embodiments of the present invention provide a surface roughness of the hole sidewalls of between 0.1 µm and 1.6 µm such that a surface of the towers subsequently formed (as discussed below) scatters light to a point of being nearly non-reflective of incident light back out of the tower array.

Figure 6:
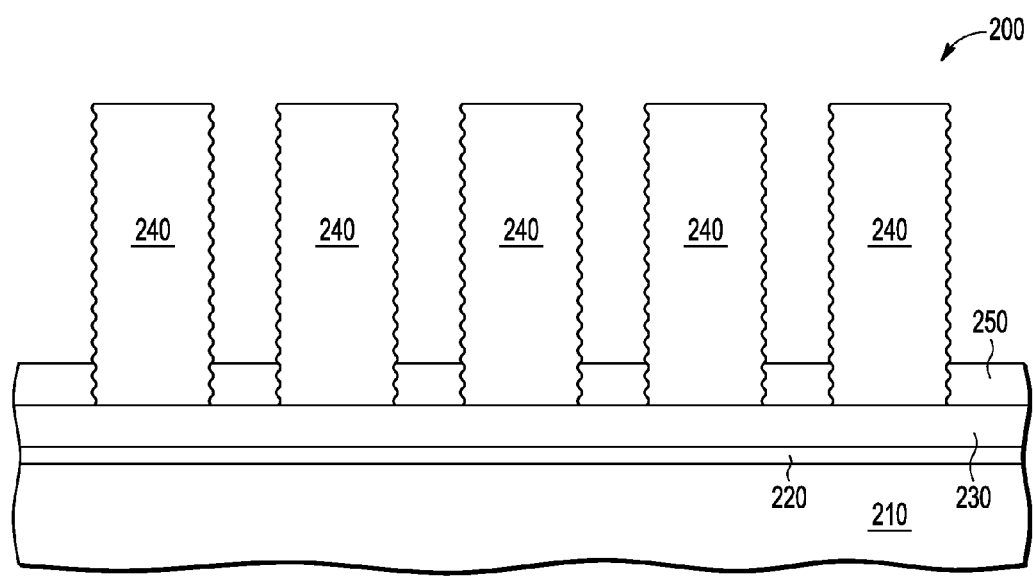
FIG. 6 is a simplified block diagram illustrating the cross sectional view of the three-dimensional solar cell assembly structure at a later stage in processing, according to an embodiment of the present invention.

FIG. 6 is a simplified block diagram illustrating the cross sectional view of the three-dimensional solar cell assembly structure at a later stage in processing. Tower structures 240 are formed by filling holes 510 with a metal or metal alloy appropriate to forming nano-structures. In one embodiment, nickel is used to form tower structures 240 and is applied through an electroplating process. In other embodiments, the tower forming metal is provided to the holes using one of an electroless plating method, chemical vapor deposition techniques, and physical vapor deposition techniques (e.g., evaporation, sputtering, and the like). The sidewalls of the metal tower structures assume the same roughness profile provided to holes 510, since the holes are a mold for the metal tower structures. For the deposition techniques that form blanket films (e.g., chemical and physical vapor deposition), CMP or an etch step can be used to isolate the tower structure metal. After completing the process for forming the metal tower structures, the remaining photoresist is removed using, for example, a chemical removal process known in the art.

After removal of photoresist layer 310, tower structures 240 are coated with a photovoltaic layer 260, as illustrated in FIG. 2. As discussed above, the surface of photovoltaic layer 260 assumes a similar roughness profile to that of tower structures 240. Also as discussed above, a clear conducting material such as indium tin oxide is applied to the structure to provide a conductive path for electrons released by incident photons.

In this manner, improved efficiency of three-dimensional solar cells can be realized by intentionally applying surface roughness to nano-scale tower structures of such a solar cell. The increased roughness increases available surface area for incident photons to interact with photovoltaic material. Further, the increased roughness increases likelihood of absorption of all photonic energy incident upon the three-dimensional solar cell by increasing photon reflection among tower structures of the three-dimensional solar cell.

By now it should be appreciated that a method for forming a three-dimensional photovoltaic cell has been provided, in which the method includes forming a conductive layer over a substrate, forming a passivation layer over the conductive layer, forming a photoresist layer over the passivation layer, patterning the photoresist layer for one or more holes, etching the passivation layer to form the one or more holes such that a sidewall of each of the one or more holes through the photoresist layer has a surface roughness, forming a conductive material in a hole of the one or more holes, and removing the photoresist layer. The sidewalls of the conductive material have the surface roughness from the sidewall of the corresponding hole through the photoresist layer. Etching the passivation layer is performed such that the sidewall surface roughness of the conductive material will provide a selected level of scattering of light incident on the conductive material sidewall.

In one aspect of the above embodiment forming the conductive material includes an electroplating process. In a further aspect, the conductive material includes one of a metal or a metal alloy. In yet a further aspect, the conductive material can include one of nickel ore zinc.

In another aspect of the above embodiment, increasing the surface roughness of the hole sidewalls through the photoresist layer is performed by increasing power used during the etching process. In a different aspect of the above embodiment, increasing the surface roughness of the hole sidewalls through the photoresist layer is performed by decreasing the pressure of gas is used during the etching process. In still a different aspect of the above embodiment, increasing the surface roughness of the hole sidewalls through the photoresist layer is performed by increasing a flow rate of one or more gases used during the etching process. And in another aspect of the above embodiment, the etching is performed to selectively provide a surface roughness of the hole sidewalls through the photoresist layer of between 0.1 µm and 1.6 µm.

Another embodiment provides for a three dimensional photovoltaic device that includes a plurality of tower structures having a photovoltaic coating along a top and sidewalls of each tower structure, a conductive layer formed over a substrate, and a passivation layer formed over the conductive layer. The sidewalls of each tower structure have a surface roughness providing a selected level of scattering of light incident on the tower structures and each tower structure has a conductive core material. The conductive core material of each tower structure is coupled to the conductive layer.

In one aspect of the above embodiment, the plurality of tower structures are performed by a process including: forming the passivation layer over the conductive layer, forming a photoresist layer over the passivation layer, patterning the photoresist layer for a plurality of holes, etching the passivation layer to form the plurality of holes, forming the conductive core material in the one or more holes through both the passivation layer and photoresist layer, and removing the photoresist layer. In this process, the etching is performed such that a sidewall of each of the plurality of holes through the photoresist layer has a surface roughness. In a further aspect, the surface roughness of the holes provides the selected level of scattering of light incident on the tower structures.

In another aspect of the above embodiment, a tower structure of the plurality of tower structures is approximately 10 microns in height over the conductive layer and approximately 4 microns in diameter. In a further aspect, the surface roughness of the tower structures is between 0.1 and 1.6 microns.

In yet another aspect of the above embodiment, the conductive core material includes one of a metal or a metal alloy. In a further aspect, the conductive core material includes nickel or zinc.

In another aspect of the above embodiment, the photovoltaic coating is one of cadmium telluride or cadmium sulfate.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, p-type semiconductor materials can be replaced with n-type semiconductor materials. Accordingly, the specification and Figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for forming a three-dimensional photovoltaic cell, the method comprising:
    forming a conductive layer over a substrate;
    forming a passivation layer over the conductive layer;
    forming a photoresist layer over the passivation layer;
    patterning the photoresist layer for one or more holes;
    etching the passivation layer to form the one or more holes, wherein
        said etching is performed such that a sidewall of each of the one or more holes through the photoresist layer has a surface roughness;
    forming a conductive material in a hole of the one or more holes; and
    removing the photoresist layer, wherein
        sidewalls of the conductive material have the surface roughness, and
        said etching the passivation layer is performed such that the sidewall surface roughness of the conductive material provides a selected level of scattering of light incident on the sidewalls.

2. The method of claim 1 wherein said forming the conductive material comprises electroplating.

3. The method of claim 2 wherein the conductive material in the hole comprises one of a metal or a metal alloy.

4. The method of claim 3 wherein the conductive material comprises nickel or zinc.

5. The method of claim 1 wherein said etching the passivation layer is performed using an aggressive dry etch process having an increased power as compared with a non-aggressive dry etch process, resulting in an increased surface roughness of the hole sidewalls through the photoresist layer.

6. The method of claim 1 wherein said etching the passivation layer is performed using an aggressive dry etch process having a decreased pressure of gasses as compared with a non-aggressive dry etch process, resulting in an increased surface roughness of the hole sidewalls through the photoresist layer.

7. The method of claim 1 wherein said etching the passivation layer is performed using an aggressive dry etch process having an increased flow rate of one or more gasses as compared with a non-aggressive dry etch process, resulting in an increased surface roughness of the hole sidewalls through the photoresist layer.

8. The method of claim 1 further comprising:
    performing said etching to selectively provide a surface roughness of the hole sidewalls through the photoresist layer of between 0.1 µm and 1.6 µm, wherein the surface roughness is a mean of absolute values of profile heights measured from a mean line averaged over the profile.

* * * * *